(12) United States Patent
Kuhtz et al.

(10) Patent No.: US 10,141,494 B2
(45) Date of Patent: Nov. 27, 2018

(54) HEADSET AND HEADPHONE

(75) Inventors: Jan Peter Kuhtz, Celle (DE); Martin Streitenberger, Hannover (DE); André Grandt, Wedemark (DE); Elmar Schulze, Lehrte (DE); Hatem Foudhaili, Hannover (DE)

(73) Assignee: Sennheiser electronic GmbH & Co. KG, Wedemark (DE)

( * ) Notice: Subject to any disclaimer, the term of this patent is extended or adjusted under 35 U.S.C. 154(b) by 225 days.

(21) Appl. No.: 13/384,027

(22) PCT Filed: Jul. 16, 2010

(86) PCT No.: PCT/EP2010/060346
§ 371 (c)(1),
(2), (4) Date: Feb. 23, 2012

(87) PCT Pub. No.: WO2011/007000
PCT Pub. Date: Jan. 20, 2011

(65) Prior Publication Data
US 2012/0140941 A1  Jun. 7, 2012

(30) Foreign Application Priority Data

Jul. 17, 2009  (DE) .................. 20 2009 009 804 U

(51) Int. Cl.
*H04R 1/10* (2006.01)
*G10K 11/178* (2006.01)
(Continued)

(52) U.S. Cl.
CPC ........ *H01L 39/2487* (2013.01); *B01J 15/005* (2013.01); *B01J 19/285* (2013.01);
(Continued)

(58) Field of Classification Search
CPC .............. H04R 1/1083; H04R 2420/09; G10K 11/178; G10K 11/1788; G10K 11/16; G10K 2210/1081; G10L 25/93
(Continued)

(56) References Cited

U.S. PATENT DOCUMENTS 5,497,426 A * 3/1996 Jay ........................... A61B 7/04
381/67
5,604,813 A * 2/1997 Evans .................. G10K 11/178
381/71.6
(Continued)

FOREIGN PATENT DOCUMENTS

DE   20 2009 001 941       7/2009
EP            2202998 A1 *  6/2010
(Continued)

OTHER PUBLICATIONS

International Search Report for Application No. PCT/EP2010/060346 dated Sep. 21, 2010.

*Primary Examiner* — Yogeshkumar Patel
(74) *Attorney, Agent, or Firm* — Haug Partners LLP

(57) ABSTRACT

There is provided a headset having at least one microphone for detecting ambient noises, at least one electroacoustic reproduction transducer and a control unit for controlling the headset. The headset also has a digital active noise reduction unit for performing digital active noise reduction based on the ambient noises recorded by the microphone. The headset further has a data interface for receiving data and/or parameters for the headset and for outputting data and/or parameters stored in the headset.

28 Claims, 2 Drawing Sheets

(51) Int. Cl.
*H01L 39/24* (2006.01)
*B01J 15/00* (2006.01)
*B01J 19/28* (2006.01)
*C01B 35/02* (2006.01)

(52) U.S. Cl.
CPC .......... *C01B 35/023* (2013.01); *G10K 11/178* (2013.01); *H04R 1/1083* (2013.01); *B01J 2219/0009* (2013.01); *B01J 2219/00135* (2013.01); *G10K 2210/1081* (2013.01); *H04R 2420/09* (2013.01)

(58) Field of Classification Search
USPC ....... 381/71.7, 71.8, 71.1, 71.6, 91, 92, 122, 381/384; 704/E21.004, E11.003; 359/630
See application file for complete search history.

(56) References Cited

U.S. PATENT DOCUMENTS

| | | | | |
|---|---|---|---|---|
| 5,675,658 A * | 10/1997 | Brittain | A61F 11/14 | 381/186 |
| 5,937,070 A * | 8/1999 | Todter | G10K 11/178 | 381/71.6 |
| 6,035,050 A * | 3/2000 | Weinfurtner | H04R 25/507 | 381/313 |
| 6,061,456 A * | 5/2000 | Andrea | G10K 11/178 | 381/71.13 |
| 6,078,672 A * | 6/2000 | Saunders | G10K 11/178 | 381/71.6 |
| 6,278,786 B1 * | 8/2001 | McIntosh | G10K 11/178 | 381/71.6 |
| 6,396,930 B1 * | 5/2002 | Vaudrey | A61B 5/121 | 381/60 |
| 6,532,296 B1 * | 3/2003 | Vaudrey | G10K 11/178 | 381/371 |
| 7,283,635 B1 * | 10/2007 | Anderson | H04M 1/60 | 381/384 |
| 8,306,240 B2 * | 11/2012 | Pan | G10K 11/178 | 381/94.1 |
| 8,355,512 B2 * | 1/2013 | Pan | G10K 11/178 | 381/71.11 |
| 8,781,147 B1 * | 7/2014 | Giuroiu | H04R 1/1091 | 381/309 |
| 2001/0036283 A1 * | 11/2001 | Donaldson | G10K 11/178 | 381/71.11 |
| 2001/0050993 A1 * | 12/2001 | Douglas | G10K 11/178 | 381/71.6 |
| 2003/0185403 A1 * | 10/2003 | Sibbald | G10K 11/178 | 381/71.6 |
| 2003/0198357 A1 * | 10/2003 | Schneider | G10L 21/0208 | 381/94.2 |
| 2003/0228023 A1 * | 12/2003 | Burnett | G10L 21/0208 | 381/92 |
| 2005/0013447 A1 * | 1/2005 | Crump | H02M 3/156 | 381/71.6 |
| 2005/0201585 A1 | 9/2005 | Jannard et al. | | |
| 2006/0069556 A1 * | 3/2006 | Nadjar | G10K 11/178 | 704/229 |
| 2006/0238877 A1 * | 10/2006 | Ashkenazi | G02B 27/0093 | 359/630 |
| 2007/0025561 A1 * | 2/2007 | Gauger, Jr. | H04R 1/1025 | 381/71.6 |
| 2007/0027406 A1 * | 2/2007 | LaPlaca | A61B 5/16 | 600/558 |
| 2007/0154052 A1 * | 7/2007 | Gantz | H04R 1/1033 | 381/384 |
| 2007/0160223 A1 * | 7/2007 | Cusack, Jr. | G10K 11/178 | 381/71.1 |
| 2007/0225035 A1 * | 9/2007 | Gauger, Jr. | H04M 1/6066 | 455/553.1 |
| 2008/0013744 A1 * | 1/2008 | Von Dach | H04R 25/453 | 381/56 |
| 2008/0013747 A1 * | 1/2008 | Tran | A61B 7/04 | 381/67 |
| 2008/0101638 A1 * | 5/2008 | Ziller | H04M 1/6025 | 381/334 |
| 2008/0192942 A1 * | 8/2008 | Yamkovoy | H04R 3/00 | 381/58 |
| 2008/0205663 A1 * | 8/2008 | Crump | H02M 3/156 | 381/71.6 |
| 2008/0310665 A1 * | 12/2008 | Kuhtz | H04R 1/1058 | 381/375 |
| 2009/0007596 A1 * | 1/2009 | Goldstein | A61B 5/6817 | 63/1.11 |
| 2009/0245529 A1 * | 10/2009 | Asada | G10K 11/17881 | 381/71.6 |
| 2009/0262969 A1 * | 10/2009 | Short | H04R 3/005 | 381/370 |
| 2009/0279709 A1 * | 11/2009 | Asada | G10K 11/178 | 381/71.1 |
| 2009/0295602 A1 * | 12/2009 | Cernasov | G01C 23/00 | 340/974 |
| 2009/0323975 A1 * | 12/2009 | Groesch | H04R 1/1091 | 381/71.1 |
| 2009/0325131 A1 * | 12/2009 | Cernasov | G06F 3/012 | 434/30 |
| 2010/0061563 A1 * | 3/2010 | Gelhard | H04R 3/04 | 381/71.4 |
| 2010/0105447 A1 * | 4/2010 | Sibbald | G10K 11/178 | 455/570 |
| 2010/0166203 A1 * | 7/2010 | Peissig | G10K 11/178 | 381/71.6 |
| 2010/0166206 A1 * | 7/2010 | Macours | G10K 11/178 | 381/71.6 |
| 2010/0246836 A1 * | 9/2010 | Johnson, Jr. | H04R 5/04 | 381/58 |
| 2010/0246845 A1 * | 9/2010 | Burge | H04R 1/1041 | 381/71.6 |
| 2010/0246846 A1 * | 9/2010 | Burge | H04R 1/1041 | 381/74 |
| 2010/0246847 A1 * | 9/2010 | Johnson, Jr. | H04R 1/1041 | 381/74 |
| 2010/0260341 A1 * | 10/2010 | Sander | H04R 1/1041 | 381/1 |
| 2010/0272275 A1 * | 10/2010 | Carreras | G10K 11/178 | 381/71.6 |
| 2010/0272276 A1 * | 10/2010 | Carreras | G10K 11/178 | 381/71.6 |
| 2010/0272277 A1 * | 10/2010 | Joho | G10K 11/178 | 381/71.6 |
| 2010/0272278 A1 * | 10/2010 | Joho | G10K 11/17833 | 381/71.6 |
| 2010/0272279 A1 * | 10/2010 | Joho | G10K 11/178 | 381/71.6 |
| 2010/0272280 A1 * | 10/2010 | Joho | G10K 11/178 | 381/71.6 |
| 2010/0272281 A1 * | 10/2010 | Carreras | G10K 11/178 | 381/71.6 |
| 2010/0272282 A1 * | 10/2010 | Carreras | G10K 11/178 | 381/71.6 |
| 2010/0272283 A1 * | 10/2010 | Carreras | G10K 11/178 | 381/71.6 |
| 2010/0272284 A1 * | 10/2010 | Joho | G10K 11/178 | 381/71.8 |
| 2010/0274564 A1 * | 10/2010 | Bakalos | G10K 11/178 | 704/500 |
| 2010/0278348 A1 * | 11/2010 | Yamkovoy | H04R 5/033 | 381/58 |
| 2010/0278349 A1 * | 11/2010 | Yamkovoy | H04R 1/1091 | 381/58 |
| 2010/0296666 A1 * | 11/2010 | Lin | G10K 11/178 | 381/71.6 |
| 2011/0007927 A1 * | 1/2011 | Hedrick | H04R 1/105 | 381/376 |
| 2011/0012667 A1 * | 1/2011 | Yamkovoy | H03K 5/1254 | 327/434 |
| 2011/0013780 A1 * | 1/2011 | Yamkovoy | H04R 29/00 | 381/58 |

(56) References Cited

U.S. PATENT DOCUMENTS

| | | | |
|---|---|---|---|
| 2011/0026724 A1* | 2/2011 | Doclo | G10K 11/178 381/71.8 |
| 2011/0038484 A1* | 2/2011 | Macours | H04R 5/04 381/17 |
| 2011/0043382 A1* | 2/2011 | Wang | G01H 3/14 340/945 |
| 2011/0103602 A1* | 5/2011 | Chang | G01H 3/14 381/59 |
| 2011/0188665 A1* | 8/2011 | Burge | G10K 11/16 381/71.6 |
| 2011/0227631 A1* | 9/2011 | Yamkovoy | H04R 5/033 327/434 |
| 2011/0243343 A1* | 10/2011 | Gauger, Jr. | G10L 21/0208 381/71.6 |
| 2011/0243344 A1* | 10/2011 | Bakalos | G10K 11/178 381/71.6 |
| 2011/0243345 A1* | 10/2011 | Carreras | G10L 21/0208 381/71.6 |
| 2012/0308030 A1* | 12/2012 | Yamkovoy | H04R 1/10 381/74 |
| 2012/0308048 A1* | 12/2012 | Yamkovoy | H04R 1/1091 381/111 |
| 2013/0039507 A1* | 2/2013 | Park | G10K 11/1788 381/71.6 |
| 2013/0202135 A1* | 8/2013 | Hedrick | H04R 1/46 381/151 |

FOREIGN PATENT DOCUMENTS

| | | |
|---|---|---|
| WO | WO 2007/016020 | 2/2007 |
| WO | WO 2007/098793 A1 * | 9/2007 |
| WO | WO 2007/098793 A1 * | 11/2007 |
| WO | WO 2008/095013 | 8/2008 |
| WO | WO 2010/129241 | 11/2010 |

* cited by examiner

HEADSET AND HEADPHONE

The present application claims priority from PCT Patent Application No. PCT/EP2010/060346 filed on Jul. 16, 2010, which claims priority from German Patent Application No. DE 20 2009 009 804.4 filed on Jul. 17, 2009, the disclosures of which are incorporated herein by reference in their entirety.

BACKGROUND OF THE INVENTION

1. Field of the Invention

The present invention concerns a headset and an earphone.

2. Description of Related Art

Modern headsets or earphones, such as for example headphones, often have active noise reduction (ANR) to permit or improve operation or use of the headsets even in noisy environments such as for example a cockpit of an aircraft. In that respect active noise reduction can be effected both in analog and also in digital fashion.

SUMMARY OF THE INVENTION

An object of the present invention is to provide a headset and an earphone with improved active noise reduction.

Thus there is provided a headset having at least one microphone for detecting ambient noises, at least one electroacoustic reproduction transducer and a control unit for controlling the headset. The headset also has a digital active noise reduction unit for performing digital active noise reduction based on the ambient noises recorded by the microphone. The headset further has a data interface for receiving data and/or parameters for the headset and for outputting data and/or parameters stored in the headset.

In an aspect of the present invention the data interface is adapted to update the control (software update, firmware update, updating of the data/parameters).

In a further aspect of the invention there is provided a wireless data interface for transmitting and receiving data and/or parameters from or for the headset.

The invention also concerns an earphone comprising at least one microphone for detecting ambient noises, at least one electroacoustic reproduction transducer for outputting an audio signal to be reproduced, and a control unit for controlling the earphone. The earphone further has a digital active noise reduction unit for performing active noise reduction based on the ambient noises recorded by the microphone. The earphone further has a data interface for receiving data and/or parameters for the earphone and for outputting data and/or parameters stored in the earphone.

The invention concerns the notion of providing an interface on a headset/earphone with a digital active noise reduction unit, by way of which an update or updating of the firmware or software of the digital active noise reduction unit can be permitted.

Thus subsequent improvements in active noise reduction can be applied to the respective headset or earphone so that control of the active noise reduction units can be updated or adapted. In addition parameters both for active noise reduction and also for reproduction of audio signals by the headset can be communicated and set by the interface.

DETAILED DESCRIPTION OF EMBODIMENTS

It is to be understood that the figures and descriptions of the present invention have been simplified to illustrate elements that are relevant for a clear understanding of the present invention, while eliminating, for purposes of clarity, many other elements which are conventional in this art. Those of ordinary skill in the art will recognize that other elements are desirable for implementing the present invention. However, because such elements are well known in the art, and because they do not facilitate a better understanding of the present invention, a discussion of such elements is not provided herein.

The present invention will now be described in detail on the basis of exemplary embodiments.

Figure 1:
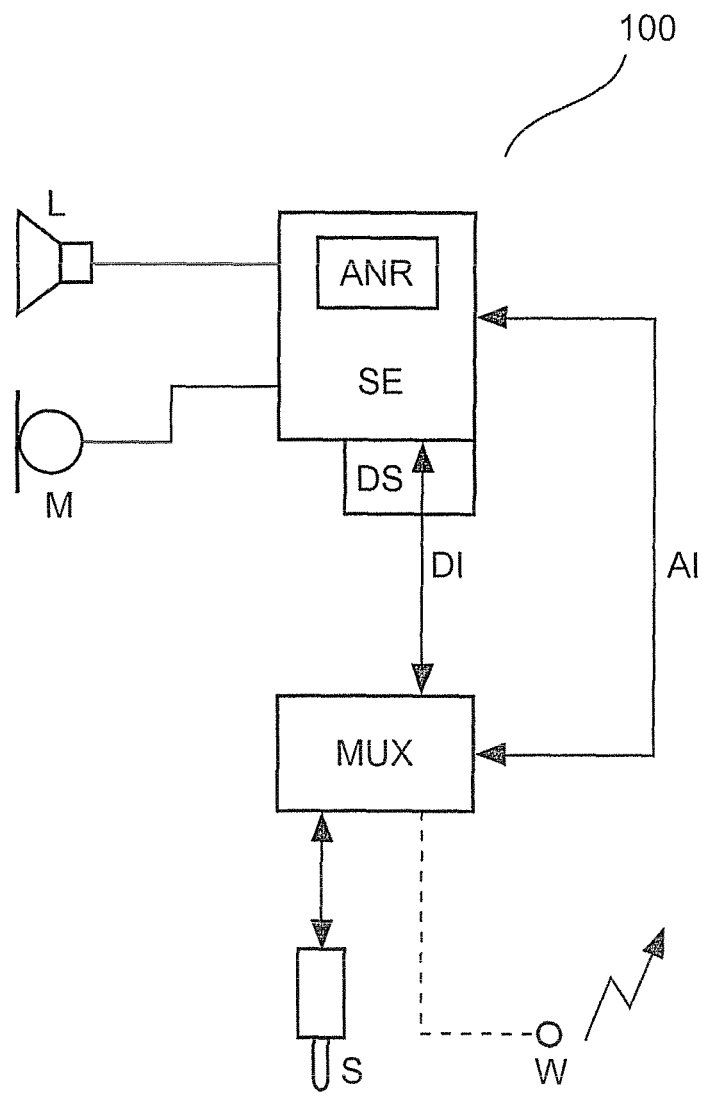
FIG. 1 shows a diagrammatic view of a headset in accordance with a first embodiment.

FIG. 1 shows a diagrammatic view of a headset in accordance with a first embodiment. The headset 100 has a microphone M and at least one electroacoustic reproduction transducer L. The headset further has a control unit SE with a digital active noise reduction unit ANR and a data interface DS. The digital active noise reduction unit ANR performs active noise reduction based on the ambient noises recorded by the microphone M and outputs a compensation signal to the electroacoustic reproduction transducer L which outputs the audio signal to be reproduced together with the compensation signal. The headset further optionally has a multiplexer unit MUX which can be connected by way of a cable to a plug S for receiving audio signals to be reproduced and for outputting speech signals recorded by a microphone of the headset. Optionally the multiplexer unit MUX can be connected to a wireless transmitter/receiver unit W to be able to wirelessly exchange data and/or parameters. The multiplexer unit MUX is capable for that purpose of receiving both audio signals from the plug S and also data signals from the plug and/or the wireless transmitter/receiver unit. In addition the multiplexer unit MUX is capable for that purpose of passing both the audio signals AI to the control unit SE and also the data signals DI to the data interface DS. The audio signals AI represent the audio signals to be reproduced by the headset. The data signals DI can be for example update information, adjusting parameters or the like. An update of the control of the control unit SE can also be effected by means of the data signals DI. Those signals for the update can be received by way of the plug and also by way of the wireless transmitter/receiver unit W As described above the multiplexer unit MUX can be connected to a (further) interface in the form of a wireless interface. Alternatively or in addition a wired interface can also be implemented. Such an interface can be based for example on a universal serial bus ("USB"), a Fireware®or other protocols. That interface can also be implemented by an audio plug S.

In the transmission of data signals adjusting parameters of the headset (compensation factor, right/left balance, a customer-specific hearing curve and head position) can also be transmitted. A firmware or software update can also be carried out. In addition it is possible to implement a remote functionality.

Optionally the parameters stored in the headset, for example of active noise reduction, can be read out and transmitted to other mobile devices such as for example headsets or earphones so that those headsets or earphones can also be adjusted by the appropriate switch-on parameters. The exchange with other mobile devices can be in wired or wireless form, for example by way Bluetooth®, wireless local area network ("WLAN"), etc. The data of the headset or adjusting parameters can be extracted and processed for service purposes.

With the headset or earphone according to the invention a subsequent update of the control of the control unit, in particular active noise reduction, can be performed. The fact that the adjusting parameters can be extracted means that they can be checked by service personnel. Finally the adjusting parameters or other data can be transmitted to other devices.

In a further embodiment there is provided an earphone, in particular a headphone. The headphone in accordance with the further embodiment substantially corresponds to the headset in accordance with the first embodiment Thus there is provided an earphone having an interface for the exchange of data and/or parameters of the earphone to permit an update of the firmware, the software or the parameters.

Figure 2:
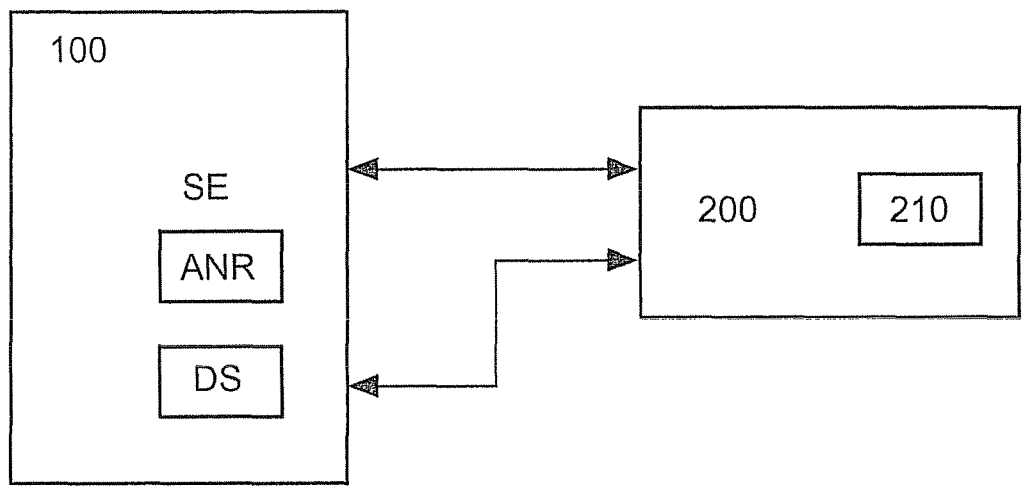
FIG. 2 shows a diagrammatic view of a headset/earphone in accordance with a second embodiment.

FIG. 2 shows a diagrammatic view of a headset/earphone in accordance with a second embodiment. The headset/earphone 100 has a control unit SE with an active noise reduction unit ANR and a digital interface DS. The headset/earphone 100 can be coupled to a media player 200. The media player can be used for the reproduction of audio signals which can then be reproduced by the headset or earphone. In addition to the audio signals the media player can transmit data signals DI like for example update information, adjusting parameters or the like.

The media player 200 can have a parameter adjusting unit 210, by means of which the parameters of the control unit SE and/or the active noise reduction unit ANR can be adjusted.

Figure 3:
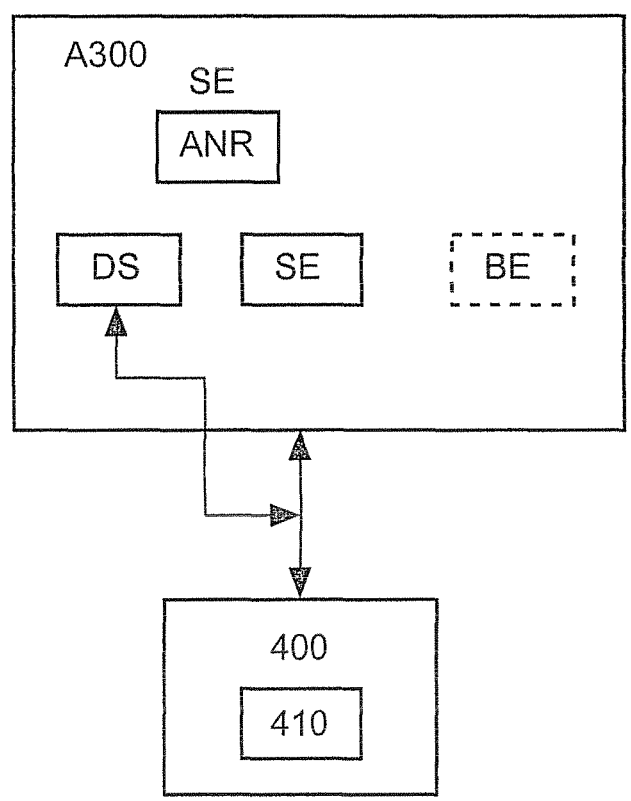
FIG. 3 shows a diagrammatic view of a headset/earphone in accordance with a third embodiment.

FIG. 3 shows a diagrammatic view of a headset/earphone in accordance with a third embodiment. The headset 300 or earphone 300 has a control unit SE with an active noise reduction unit ANR, a data interface DS, a wireless transmitting/receiving unit SE and optionally a battery unit BE. The headset or earphone 300 can be coupled to a media player 400. In this case coupling can be effected wirelessly, that is to say the media player 400 can transmit audio signals to the headset or earphone wirelessly. For that purpose the media player 400 can have a wireless transmitting/receiving unit. In addition the media player has a parameter adjusting unit 410 for adjusting the parameters of the control unit SE and/or the active noise reduction unit ANR.

The wireless transmission path between the media player 400 and the headset or earphone 300 can be used for the transmission of audio signals and for the transmission of data signals DI, The parameter adjusting unit 210, 410 in accordance with the second or third embodiments can also be implemented in the form of a software module. The parameters of the control unit SE and those of the active noise reduction unit ANR can be adjusted by means of the parameter adjusting unit 210, 410. That makes it possible to have personalised adjustment.

The active noise reduction unit according to the first, second or third embodiment is optionally digital. As a digitally implemented active noise reduction makes special demands on the digital hardware the digital hardware for active noise reduction is implemented in the headset or earphone.

The data interface DS of the first, second or third embodiment serves for firmware update and uni- or bidirectional data communication in addition to the transmission of the audio signals in order to adjust the parameters of the control unit or the active noise reduction unit ANR. In addition the data interface can be used for a user to adjust the functionality of the active noise reduction unit. For that purpose modes can be selected, adaption of noise reduction can be controlled and various profiles can be stored. Alternatively or additionally thereto the frequency response curve can be measured. Audio or noise levels can be determined and sound profiles can be determined and stored. In addition the data interface can be used for the testing and checking function during production.

The data interface used can be for example a USB interface or another digital port of the media player.

Optionally the parameter adjusting unit 210, 410 can be in the form of a software module which for example can be downloaded from an external server (for example iTunes) and installed in the media player.

If there is a wired connection between the media player and the headset or earphone then the media player can make the power supply available for the headset or earphone.

Additionally or alternatively thereto an optional battery compartment can be provided in the headset or earphone or on the cable. The power supply for the headset or earphone can be afforded by that battery compartment (with the batteries or accumulators therein).

Optionally the data interface and the audio interface can be implemented in an interface like for example a USB interface. In the case of a wireless connection the interface can be for example based on a Bluetooth®protocol or a Wi-Fi protocol.

According to the invention the parameters and adjustments at the control unit SE and the active noise reduction unit ANR can be effected by way of the media player or the parameter adjusting unit provided therein.

If no power supply for the active noise reduction unit ANR is present in accordance with the first, second or third embodiment then the active noise reduction unit ANR can be deactivated so that audio reproduction is still possible by way of the headset or earphone.

In accordance with a fourth embodiment which can be based on the first, second or third embodiment there is an optional battery compartment for the headset or the earphone. That battery compartment can be in the form of an external device or a clip-on battery compartment. In that case a basic functionality of the earphone, namely audio output, can be embodied, even if there is no voltage supply. Enhanced functionality can be made possible if there is a voltage supply for the noise reduction unit ANR. In addition the parameters for the active noise reduction unit ANR can be adjusted for example by means of a media player and the parameter adjusting unit provided therein. A communication between the earphone or headset and the media player can be wireless or wired in that case.

In a further aspect of this invention an earphone or headset can be coupled to the media player by way of a standard cable. In that case the earphone or headset then serves for audio reproduction. If a clip-on battery compartment is provided then the earphone or headset can be used for active noise reduction. The earphone or headset can also optionally be supplied wirelessly with an audio signal which is then to be reproduced. A parameter adjusting unit can be provided on the media player, which for example can be in the form of a software module. The parameters or adjustments of the active noise reduction can be effected by means of that unit.

While this invention has been described in conjunction with the specific embodiments outlined above, it is evident that many alternatives, modifications, and variations will be apparent to those skilled in the art. Accordingly, the preferred embodiments of the invention as set forth above are intended to be illustrative, not limiting. Various changes may be made without departing from the spirit and scope of the inventions as defined in the following claims.

What is claimed is:

1. A headset comprising:
at least one microphone configured to detect ambient noises;
at least one electroacoustic reproduction transducer configured to output an audio signal to be reproduced;
a control unit configured to control the headset;
a digital active noise reduction unit having an adjustable functionality and having a digital hardware; and
a data interface configured to:
couple the headset, via a bi-directional data communication, with an external media player; and
receive at least one functionality adjustment for the digital active noise reduction unit from a user via the external media player, wherein the functionality adjustment comprises adjustable parameters of the digital active noise reduction unit;
wherein the control unit is connected with the digital active noise reduction unit and the data interface;
wherein the control unit is further configured to adjust the functionality of the digital active noise reduction unit according to the received functionality adjustment, the control unit selecting a mode of digital active noise reduction of the digital active noise reduction unit according to the received functionality adjustment;
wherein the digital active noise reduction unit is configured to perform active noise reduction based at least on the ambient noises recorded by the microphone and the received functionality adjustment.

2. The headset as set forth in claim 1;
wherein the data interface is adapted to update a firmware of the digital active noise reduction unit.

3. The headset as set forth in claim 1, further comprising:
a wireless data interface configured to transmit and receive audio data and configuration parameters from or for the headset.

4. An earphone comprising:
at least one microphone configured to detect ambient noises;
at least one electroacoustic reproduction transducer configured to output an audio signal to be reproduced;
a control unit configured to control the earphone;
a digital active noise reduction unit having an adjustable functionality and having a digital hardware; and
a data interface configured to:
couple the earphone, via a bi-directional data communication, with an external media player; and
receive at least one functionality adjustment for the digital active noise reduction unit from a user via the external media player, wherein the functionality adjustment comprises adjustable parameters of the digital active noise reduction unit;
wherein the control unit is connected with the digital active noise reduction unit and the data interface;
wherein the control unit is further configured to adjust the functionality of the digital active noise reduction unit according to the received functionality adjustment, the control unit selecting a mode of digital active noise reduction of the digital active noise reduction unit according to the received functionality adjustment; and
wherein the digital active noise reduction unit is configured to perform active noise reduction based at least on the ambient noises recorded by the microphone and the received functionality adjustment.

5. The headset as set forth in claim 2, further comprising:
a wireless data interface configured to transmit and receive audio data and configuration parameters from or for the headset.

6. The headset as set forth in claim 1, further comprising:
a multiplexer unit configured to:
forward audio signals to the control unit; and
forward data signals to the data interface.

7. The headset as set forth in claim 1;
wherein the adjustable parameters include at least one of a compensation factor, right/left balance, and a customer-specific hearing curve.

8. The headset as set forth in claim 1;
wherein the adjustable parameters enable a personalized adjustment of the headset.

9. The headset as set forth in claim 1;
when the power supplied for the digital active noise reduction unit is not available, the control unit deactivates the digital noise reduction unit, but enables the reproduction of audio signals by the at least one electroacoustic reproduction transducer.

10. A system comprising:
the headset as set forth in claim 1; and
the external media player,
wherein the external media player comprises a parameter adjustment unit configured to adjust parameters of the digital active noise reduction unit according to a user input.

11. A system comprising:
the headset as set forth in claim 6; and
the external media player,
wherein the external media player comprises a parameter adjustment unit configured to adjust parameters of the digital active noise reduction unit according to a user input.

12. A system comprising:
the headset as set forth in claim 7; and
the external media player,
wherein the external media player comprises a parameter adjustment unit configured to adjust parameters of the digital active noise reduction unit according to a user input.

13. A system comprising:
the headset as set forth in claim 8; and
the external media player,
wherein the external media player comprises a parameter adjustment unit configured to adjust parameters of the digital active noise reduction unit according to a user input.

14. A system comprising:
the headset as set forth in claim 9; and
the external media player,
wherein the external media player comprises a parameter adjustment unit configured to adjust parameters of the digital active noise reduction unit according to a user input.

15. A system comprising:
the earphone as set forth in claim 4; and
the external media player,
wherein the external media player comprises a parameter adjustment unit configured to adjust parameters of the digital active noise reduction unit according to a user input.

16. The headset as set forth in claim 1;
wherein the data interface is further configured to:
output data and/or parameters stored in the headset.

17. The earphone as set forth in claim 4;
wherein the data interface is further configured to:
output data and/or parameters stored in the earphone.
18. The earphone as set forth in claim 4;
wherein the adjustable parameters comprise at least one of a compensation factor, left/right balance, and a customer-specific hearing curve.
19. The headset as set forth in claim 1;
wherein the at least one functionality adjustment comprises controlling an adaption of the digital active noise reduction.
20. The headset as set forth in claim 1;
wherein the at least one functionality adjustment comprises storing a profile of the digital active noise reduction.
21. The earphone as set forth in claim 4;
wherein the at least one functionality adjustment comprises controlling an adaption of noise reduction.
22. The earphone as set forth in claim 4;
wherein the at least one functionality adjustment comprises storing a profile of the digital active noise reduction.
23. A headset comprising:
a microphone configured to detect ambient noises;
an electroacoustic reproduction transducer configured to output an audio signal to be reproduced;
a control unit configured to control the headset;
a digital active noise reduction unit having adjustable parameters and an adjustable functionality and having a digital hardware; and
a data interface configured to:
couple the headset, via a bi-directional data communication, with an external media player; and
receive at least one functionality adjustment selected from the group consisting of selecting a mode, controlling an adaption of noise reduction, storing a profile, and combinations thereof for the headset from the external media player, wherein the functionality adjustment comprises adjustable parameters of the digital active noise reduction unit; and
wherein the control unit is connected with the digital active noise reduction unit and the data interface;
wherein the control unit is further configured to adjust the functionality of the digital active noise reduction unit according to the received functionality adjustment, the control unit selecting a mode of digital active noise reduction of the digital active noise reduction unit according to the received functionality adjustment; and
wherein the digital active noise reduction unit is configured to perform active noise reduction based at least on the ambient noises recorded by the microphone and the received functionality adjustment, and to be deactivated if the power supplied for the digital active noise reduction unit is not available.
24. An earphone comprising:
a microphone configured to detect ambient noises;
an electroacoustic reproduction transducer configured to output an audio signal to be reproduced;
a control unit configured to control the earphone;
a digital active noise reduction unit having adjustable parameters and an adjustable functionality and having a digital hardware; and
a data interface configured to:
couple the earphone, via a bi-directional data communication, with an external media player; and
receive at least one functionality adjustment from the external medial player, wherein the functionality adjustment comprises adjustable parameters of the digital active noise reduction unit and is selected from the group consisting of selecting a mode, controlling an adaption of noise reduction, storing a profile, and combinations thereof;
wherein the control unit is connected with the digital active noise reduction unit and the data interface;
wherein the control unit is further configured to adjust the functionality of the digital active noise reduction unit to the received functionality adjustment, the control unit selecting a mode of digital active noise reduction of the digital active noise reduction unit according to the received functionality adjustment; and
wherein the digital active noise reduction unit is configured to perform active noise reduction based at least on the ambient noises recorded by the microphone and the received functionality adjustment, and to be deactivated if the power supplied for the digital active noise reduction unit is not available.
25. A method for modifying at least one functionality of a headset or earphone, the headset or earphone comprising at least one sound transducer, at least one digital active noise reduction unit having a digital hardware, and a data interface, the method comprising steps of:
the sound transducer reproducing sound according to audio data provided by an external appliance via the data interface, wherein the digital active noise reduction unit reduces ambient noise by using a first noise cancelling method having a first noise cancelling mode;
the data interface receiving configuration adjustment data from said external appliance, wherein the configuration adjustment data comprises adjustable parameters of the digital active noise reduction unit;
a control unit connecting with the digital active noise reduction unit and the data interface and applying the configuration adjustment data to the digital active noise reduction unit, wherein the functionality of the digital active noise reduction unit is adjusted according to the received functionality adjustment; and
the sound transducer reproducing sound provided by said external appliance via the data interface, wherein the digital active noise reduction unit reduces ambient noise by using a second noise cancelling method having a second noise cancelling mode that is different from the first noise cancelling mode.
26. The method as set forth in claim 25,
wherein the headset or earphone further comprises at least one microphone configured to detect ambient noise, and
wherein the digital active noise reduction unit uses the detected ambient noise in reducing the ambient noise from the reproduced sound.
27. The method as set forth in claim 25,
wherein the configuration adjustment data from said external appliance are initiated by a user of the external appliance.
28. The method as set forth in claim 25, further comprising:
storing the received configuration adjustment data in the headset or earphone.

* * * * *